United States Patent
Hong et al.

[11] Patent Number: 5,960,293
[45] Date of Patent: Sep. 28, 1999

[54] METHODS INCLUDING OXIDE MASKS FOR FABRICATING CAPACITOR STRUCTURES FOR INTEGRATED CIRCUIT DEVICES

[75] Inventors: Weon-cheol Hong, Kyungki-do; Yun-seung Shin, Seoul, both of Rep. of Korea

[73] Assignee: Samsung Electronics Co., Ltd., Rep. of Korea

[21] Appl. No.: 08/806,080

[22] Filed: Feb. 25, 1997

[30] Foreign Application Priority Data

Feb. 26, 1996 [KR] Rep. of Korea .......................... 96-4699

[51] Int. Cl.$^6$ ............................................. H01L 21/8242
[52] U.S. Cl. .......................... 438/397; 438/253; 438/254; 438/396
[58] Field of Search ................................. 438/253, 254, 438/396, 397; 257/306

[56] References Cited

U.S. PATENT DOCUMENTS

| | | | |
|---|---|---|---|
| 5,330,614 | 7/1994 | Ahn | 156/631 |
| 5,393,688 | 2/1995 | Motonami et al. | 438/396 |
| 5,429,980 | 7/1995 | Yang et al. | 438/396 |
| 5,438,013 | 8/1995 | Kim et al. | 438/396 |
| 5,476,807 | 12/1995 | Lee et al. | 438/396 |
| 5,521,112 | 5/1996 | Tseng | 438/396 |
| 5,656,532 | 8/1997 | Tseng | 438/253 |
| 5,710,075 | 1/1998 | Tseng | 438/254 |
| 5,712,182 | 1/1998 | Madan | 438/253 |
| 5,766,993 | 6/1998 | Tseng | 438/253 |

*Primary Examiner*—Brian Dutton
*Assistant Examiner*—Toniae M. Thomas
*Attorney, Agent, or Firm*—Myers Bigel Sibley & Sajovec

[57] ABSTRACT

A method for forming a capacitor for an integrated circuit device includes the following steps. An interlayer dielectric layer is formed on a substrate, and a contact hole is formed in the interlayer dielectric layer. A first conductive layer is then formed on the interlayer dielectric layer, wherein the first conductive layer is electrically connected to the substrate through the contact hole. A hole having a depth less than the thickness of the first conductive layer is etched in the first conductive layer. An insulating layer is formed in the hole and the first conductive layer is then etched to a predetermined depth using the insulating layer as an etching mask to expose a side wall of an upper portion of the insulating layer. A spacer is formed on the side wall of the upper portion of the insulating layer. The first conductive layer is then etched using the insulating layer and the spacer as etching marks to form an electrode structure. The insulating layer and spacer are then removed. Lastly, the capacitor is completed by forming a dielectric layer on the electrode structure and then forming a second conductive layer on the dielectric layer.

22 Claims, 6 Drawing Sheets

METHODS INCLUDING OXIDE MASKS FOR FABRICATING CAPACITOR STRUCTURES FOR INTEGRATED CIRCUIT DEVICES

FIELD OF THE INVENTION

The present invention generally relates to methods for fabricating integrated circuit devices, and more particularly, to methods for fabricating capacitor structures for integrated circuits.

BACKGROUND OF THE INVENTION

In the fabrication of integrated circuits, the degree of integration of a dynamic random access memory (DRAM) may be limited by a decrease of memory cell capacitance resulting from a decrease in the area of a memory cell. A decrease in cell capacitance may also hinder the low-voltage operation of a memory cell. Further, decreases in capacitance may deteriorate the reading performance of the memory cell and increase the soft error rate (SER). Therefore, it would be desirable to increase the integration of semiconductor memory devices without decreasing memory cell capacitance.

As a result, capacitors having three-dimensional structures have been proposed to increase memory cell capacitance. As an Example, FIGS. 1 to 3 are cross-sectional views illustrating a method according to the prior art for forming a capacitor having a box-shaped lower electrode according to the prior art.

Referring to FIG. 1, an interlayer dielectric layer 20 and an etching stop layer 30 are sequentially formed on a semiconductor substrate 10. The interlayer dielectric layer 20 and the etching stop layer 30 can be respectively formed from borophosphosilicate glass (BPSG) and silicon nitride ($Si_3N_4$).

Referring to FIG. 2, an etching stop layer pattern 30a and an interlayer dielectric layer pattern 20a, each having an aligned contact hole exposing a predetermined region of the semiconductor substrate 10, are formed by patterning the etching stop layer 30 and the interlayer dielectric layer 20, respectively. A conductive layer 40, such as a doped polysilicon layer, is then formed on the etching stop layer filling the contact hole.

Referring to FIG. 3, a lower electrode 40a is formed by patterning the conductive layer 40 to expose the etching stop layer pattern 30a using a photoresist pattern (not shown) as an etching mask. Next, a dielectric layer 50, such as an ONO ($SiO_2/Si_3N_4/SiO_2$) layer, is formed on the lower electrode 40a and the etching stop layer pattern 30a. An upper electrode 60 is then formed by depositing a conductive material on the dielectric layer.

In accordance with the above-described method for fabricating a capacitor for an integrated circuit, the thickness of the lower electrode 40a is typically increased to increase the surface area of the electrode, thereby increasing cell capacitance. The thicker lower electrode may, however, increase a step between the cell array region and a peripheral circuit region. As a result, the patterns and step coverage may deteriorate during subsequent processing steps, such as metallization.

SUMMARY OF THE INVENTION

It is therefore an object of the present invention to provide improved methods for fabricating capacitors for integrated circuit devices.

It is another object of the present invention to provide methods for fabricating capacitors having increased capacitance.

It is yet another object of the present invention to provide methods for fabricating electrode structures having increased surface area.

It is still another object of the present invention to provide methods for fabricating capacitors providing a relatively small step difference between a memory cell array region and a peripheral circuit region.

These and other objects are provided according to the present invention by methods including the following steps. A conductive layer is formed on a substrate, and a hole is selectively etched in the conductive layer. An insulating layer is formed in the hole, and the conductive layer is then etched to a predetermined depth using the insulating layer as an etching mask to expose a sidewall of an upper portion of the insulating layer. A spacer is then formed on the exposed sidewall of the insulating layer. The conductive layer is then etched using the insulating layer and the spacer as etching masks to form an electrode structure. Accordingly, electrode structures formed by the above method have improved capacitance resulting from an increase in surface area without having to increase the thickness of the electrode structure.

The capacitor can then be completed by removing the insulating layer and the spacer and sequentially forming a dielectric layer on the electrode structure and a second conductive layer on the dielectric layer. In addition, the step of forming the conductive layer can be preceded by the steps of forming an interlayer dielectric layer on the substrate and forming a contact hole in the interlayer dielectric layer to expose a portion of the substrate. Therefore, when the conductive layer is formed, the conductive layer will be electrically connected to the substrate through the contact hole.

An undercut region can be formed between the electrode structure and the interlayer dielectric layer to increase the surface area of the electrode structure. A first method of forming the undercut region can include the step of etching the interlayer dielectric layer to a depth less than a thickness of the interlayer dielectric layer during the step of removing the insulating layer and the spacer. In this step, the etching rate of the material comprising the interlayer dielectric layer is chosen to be slower than the etching rate of the material comprising the insulating layer and the material comprising the spacer. In a preferred embodiment, the interlayer dielectric layer comprises borophosphosilicate glass (BPSG), the insulating layer comprises tetra-ethyl-orthosilicate (TEOS) base dioxide, and the spacer comprises oxide formed using plasma enhanced chemical vapor deposition (PECVD) with a source gas comprising $SiH_4$.

Alternatively, a second method for forming the undercut region includes preceding the step of forming the conductive layer with the steps of forming an etching stop layer on the interlayer dielectric layer, and then forming a second insulating layer on the etching stop layer. Thus, the second insulating layer is removed with the insulating layer and the spacer, so as to create the undercut region and to expose the etching stop layer. The etching stop layer can then be removed to expose the interlayer dielectric layer.

According to a third method for forming the undercut region, the step of removing the insulating layer and the spacer is preceded by the steps of forming a first protective layer over the electrode structure and the interlayer dielectric layer, and then etching back the protective layer to a thickness that exposes the insulating layer and the spacer. Thus, the interlayer dielectric layer is protected by the protective layer during the step of removing the insulating layer and the spacer. Following the step of removing the insulating layer and the spacer, the protective layer can be removed to expose the interlayer dielectric layer. The interlayer dielectric layer can then be etched down to a predetermined depth so as to form the undercut region.

The methods and structures of the present invention can thus be used to provide a capacitor that has increased capacitance without an increase in the step difference.

DESCRIPTION OF PREFERRED EMBODIMENTS

Figure 1:
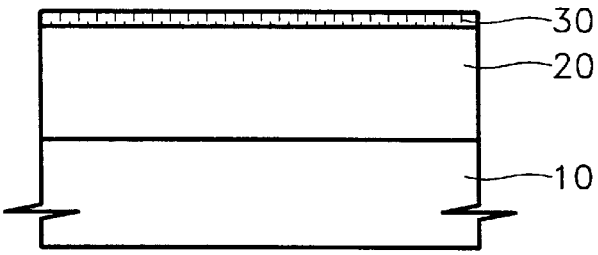
FIGS. 1 to 3 are cross-sectional views illustrating steps of a method for fabricating a capacitor according to the prior art.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thicknesses of the layers and regions are exaggerated for clarity, and are not drawn to scale. Further, like reference numerals designate like elements throughout.

Figure 4:
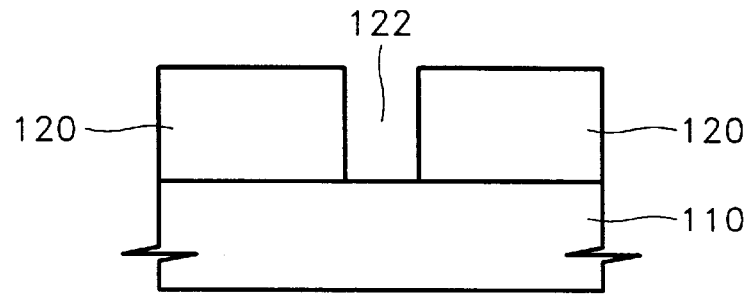
FIGS. 4 to 11 are cross-sectional views illustrating steps of a method for fabricating a capacitor according to a first aspect of the present invention.

A method for fabricating a capacitor according to the present invention will be described in detail below with reference to FIGS. 4 to 11. In FIG. 4, the step of forming an interlayer dielectric layer 120 is illustrated. Specifically, the interlayer dielectric layer 120 is formed on a semiconductor substrate 110 using a technique such as chemical vapor deposition (CVD). The interlayer dielectric layer 120 is preferably formed from a layer of borophosphosilicate glass (BPSG). A contact hole 122 is then formed in the interlayer dielectric layer 120 to expose a predetermined region of the semiconductor substrate 110.

Figure 5:
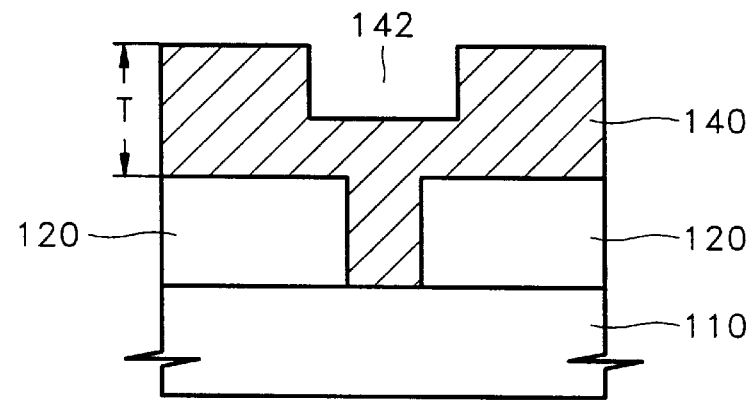

In FIG. 5, the step of forming a conductive layer 140 is illustrated. This conductive layer can subsequently be used to form a storage electrode. Specifically, the conductive layer 140 can be a layer of a conductive material, such as doped polysilicon, formed on the interlayer dielectric layer 120 of FIG. 4 using a technique such as low pressure CVD (LPCVD). The conductive layer 140 is formed to a predetermined thickness T. A photoresist pattern is then formed on the conductive layer 140 to expose a portion of the conductive layer 140 opposite the contact hole 122, as shown in FIG. 5. Using the photoresist pattern as an etching mask, a hole 142 is formed in the conductive layer 140 opposite the contact hole 122 by etching the conductive layer 140 to a depth that is less than the predetermined thickness T.

Figure 6:
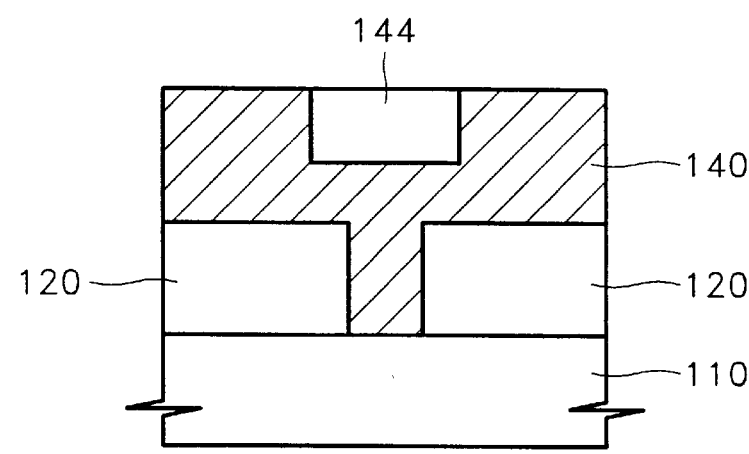

In FIG. 6, the step of forming an insulating layer 144 in the hole 142 is illustrated. After removing the photoresist pattern used to form the hole 142, a layer of insulating material is formed on the conductive layer 140. The insulating material preferably comprises a material with a wet etching rate with respect to an oxide etchant, such as HF, that is higher than that of the material comprising the interlayer dielectric layer 120. For example, a suitable material for the insulating layer comprises tetra-ethyl-orthosilicate (TEOS) oxide. The insulating layer 144 is then patterned by using a mask to etch back the layer of insulating material.

Figure 7:
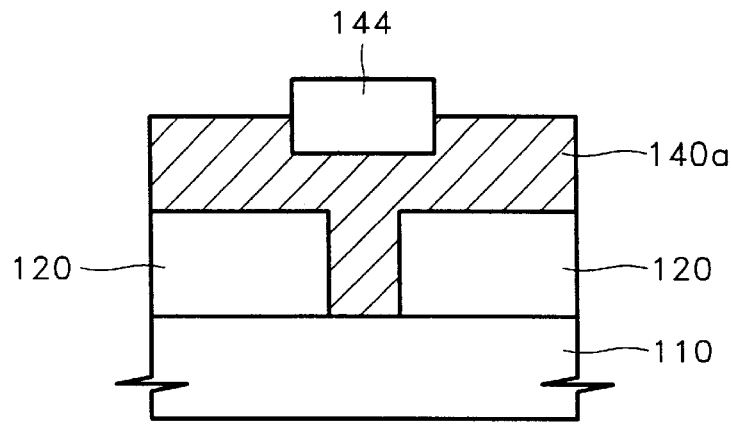

In FIG. 7, the step of forming a modified conductive layer 140a is illustrated. Using the insulating layer 144 as an etching mask, the modified conductive layer 140a is formed by etching the conductive layer 140 to a predetermined depth to expose an upper sidewall of the insulating layer 144.

Figure 8:
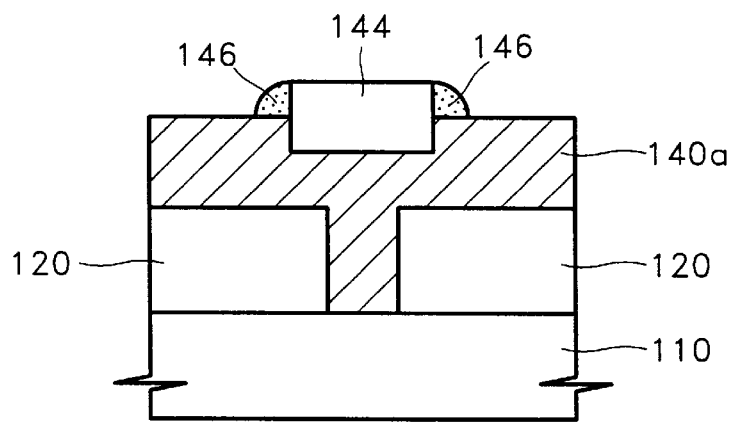

In FIG. 8, the step of forming a spacer 146 on the exposed sidewalls of the upper portion of the insulating layer 144 is illustrated. Specifically, a layer of a second insulating material layer is formed on the insulating layer 144 and the conductive layer 140a. The second insulating material preferably has an etching rate that is higher than that of the interlayer dielectric layer 120 and a dry etching rate that is higher than that of the insulating layer 144. For example, an oxide formed using a plasma enhanced CVD (PECVD) method in which the source gas comprises $SiH_4$ (i.e., "p-$SiH_4$ oxide film") can be used as the second insulating material. The spacer 146 is then formed on the upper exposed sidewall of the insulating layer 144 by anisotropically etching the layer of the second insulating material.

Figure 9:
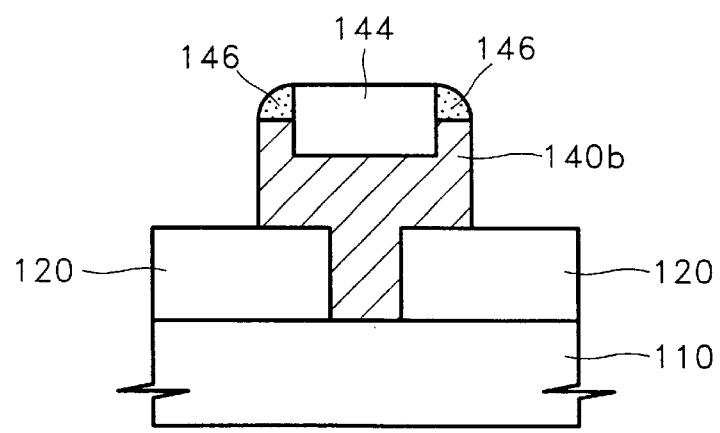

In FIG. 9, the step of forming a cylindrical storage electrode 140b is illustrated. Using the insulating layer 144 and the spacer 146 as etching masks, the cylindrical storage electrode 140b is formed by etching the modified conductive layer pattern 140a so as to expose the interlayer dielectric layer 120.

Figure 10:
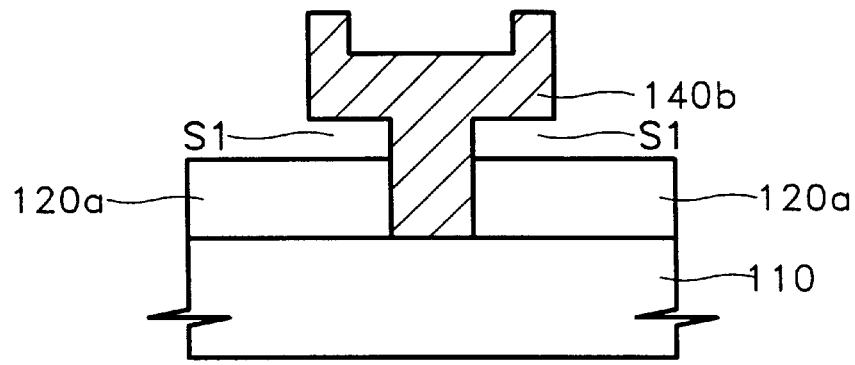

In FIG. 10, the step of removing the insulating layer 144 and the spacer 146 is illustrated. Specifically, the insulating layer 144 and the spacer 146 are preferably removed by wet etching, wherein the etchant includes HF. Because the interlayer dielectric layer 120, the insulating layer 144 and the spacer 146 have different etching rates (i.e., the etching rate of the BPSG of the interlayer dielectric layer 120 is 760 Å/min, the etching rate of the TEOS oxide of the insulating layer 144 is 3000 Å/min, and the etching rate of the p-$SiH_4$ of the spacer 146 is 2700 Å/min), the interlayer dielectric layer 120 may be etched to a relatively small thickness while the insulating layer 144 and the spacer 146 are completely removed from the storage electrode 140b. Thus, a modified interlayer dielectric layer 120a is formed. The surface area of the storage electrode 140b can be increased by etching the modified interlayer dielectric layer 120a to form an undercut region S1, as shown in FIG. 10.

Figure 11:
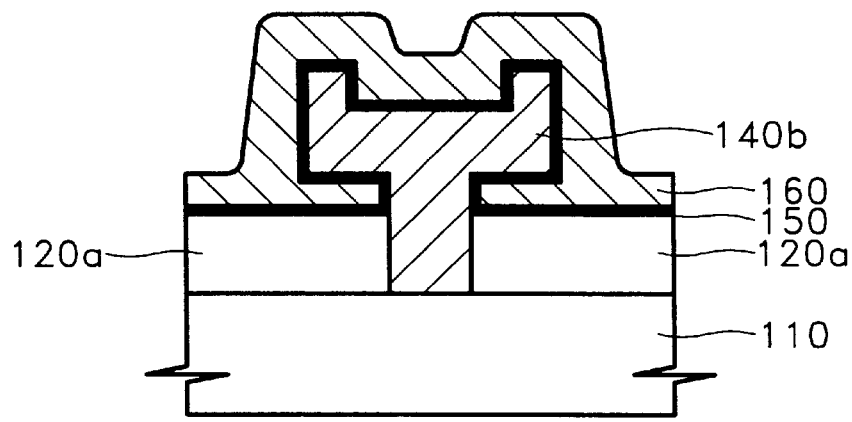

In FIG. 11, the steps of completing the capacitor are illustrated. Particularly, a dielectric layer 150 is formed on the electrode structure 140b. A conductive material layer 160 is then formed on the dielectric layer to form a plate electrode for the capacitor.

Figure 2:
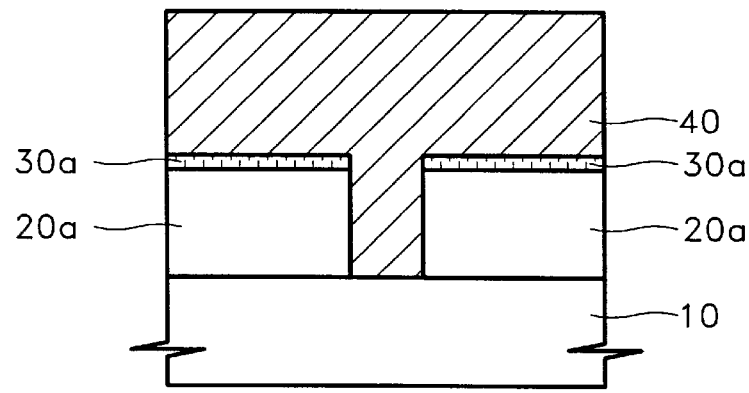
Figure 3:
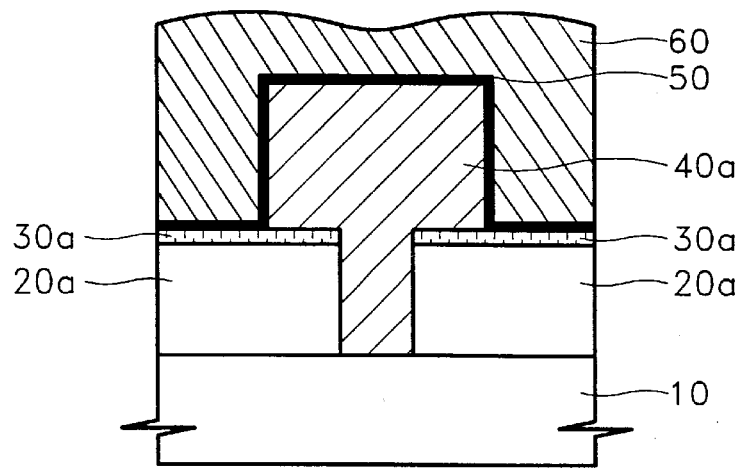
Figure 12:
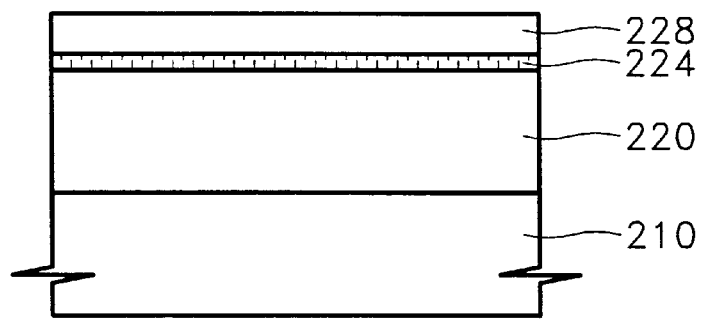
FIGS. 12 to 16 are cross-sectional views illustrating steps of a method for fabricating a capacitor according to a second aspect of the present invention.

A second method for fabricating a capacitor according to a second aspect of the present invention is described below with reference to FIGS. 12 to 16. In FIG. 12, the steps of forming an interlayer dielectric layer 220, an etching stop layer 224, and an insulating layer 228 are illustrated. The interlayer dielectric layer 220 is initially formed on a semiconductor substrate 210 using the same steps described above with regard to FIG. 2. Next, an etching stop layer 224 is formed on the interlayer dielectric layer 220 to a thickness of approximately 100–200 Å. The etching stop layer 224 is provided to prevent etching of the interlayer dielectric layer 220 during the formation of the storage electrode in the following steps. The etching stop layer 224 preferably is formed from a material comprising SiN or SiON. The insulating layer 228 is deposited on the etching stop layer 224 to a thickness of approximately 1000–2000 Å. The insulating layer 228 is removed in the following process to form an undercut region. It is worth noting that the present method does not place any particular limitations on the etching rate of the material used for forming the insulating layer 228. In fact, any commonly used insulating material, such as silicon nitride, can be used for forming the insulating layer 228.

Figure 13:
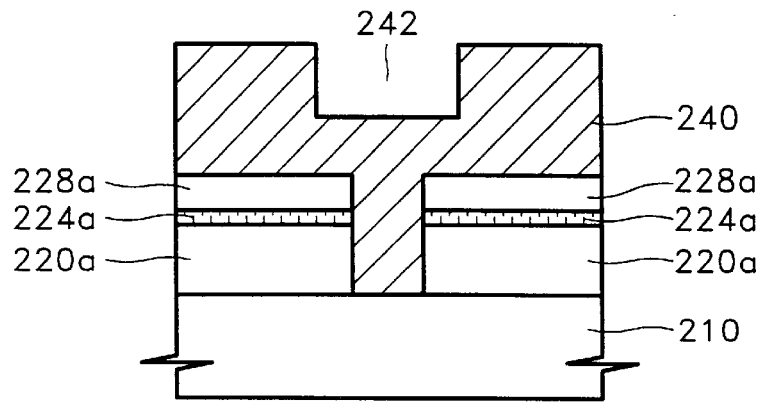

In FIG. 13, the step of forming the conductive layer 240 that is subsequently used in forming the storage electrode is illustrated. Specifically, the insulating layer 228, the etching stop layer 224, and the interlayer dielectric layer 220 are patterned and etched to form an undercut pattern 228a, an etching stop layer pattern 224a, and an interlayer dielectric layer pattern 220a so as to expose a predetermined region of the semiconductor substrate 210. After forming the conductive layer 240 on the insulating layer using steps similar to those described above with reference to FIG. 5, a hole 242 is formed by etching the conductive layer 240 using a photoresist pattern.

Figure 14:
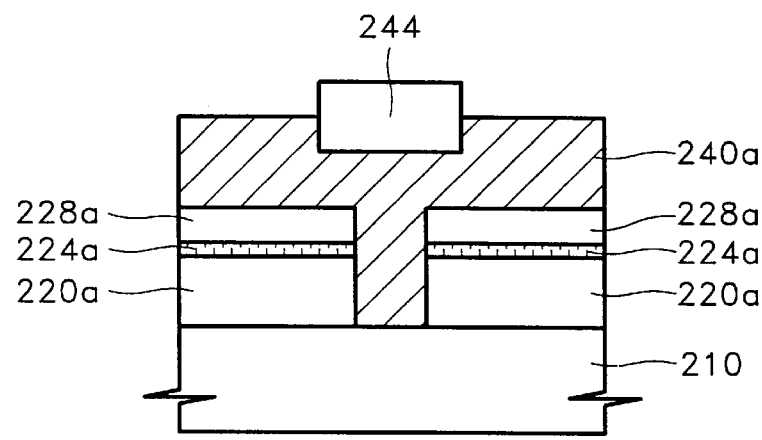

In FIG. 14, the steps of forming a second insulating layer 244 and a modified conductive layer pattern 240a are illustrated. Specifically, the second insulating layer 244 is formed in the hole 242 of the conductive layer 240 using steps similar to those described above with reference to FIG. 6. Preferably, the second insulating layer 244 is formed with the same material used to form the insulating layer 228. Further, the modified conductive layer 240a exposes the sidewalls of the upper portion of the second insulating layer 244, and this layer is formed using steps similar to those described above with reference to FIG. 7. The wet etching rate of the insulating material comprising the second insulating layer 244 is not critical because the etching stop layer protects the interlayer dielectric layer. Moreover, the second insulating layer 244 can be formed using a material having the same etching rate as that of the insulating material used for the interlayer dielectric layer 220.

Figure 15:
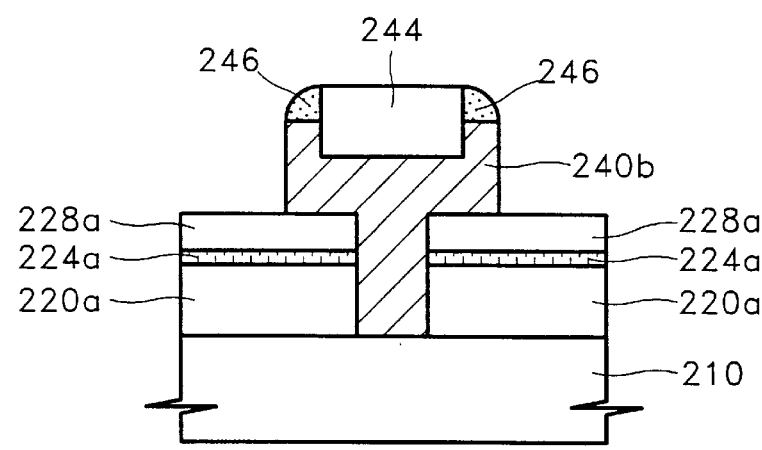

In FIG. 15, the steps of forming a spacer 246 and a storage electrode 240b are illustrated. The spacer 246 is formed on the exposed sidewalls of the second insulating layer 244 using steps similar to those described above with reference to FIGS. 8 and 9. The insulating material for forming the spacer 246, however, preferably has a higher dry etching rate than the insulating material used for the insulating layer 244. Using the second insulating layer 244 and the spacer 246 as etching masks, the cylindrical storage electrode 240b is then formed by etching the modified conductive layer pattern 240a, thereby exposing the undercut pattern 228a.

Figure 16:
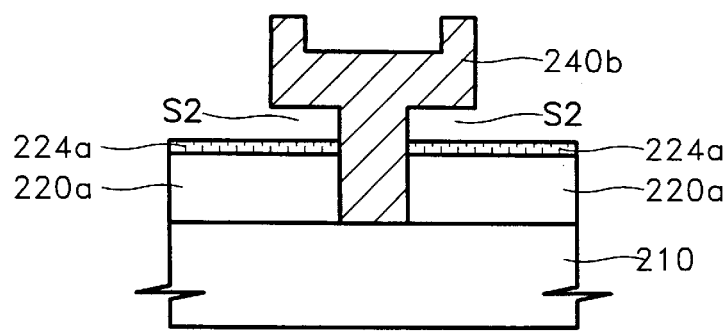

In FIG. 16, the second insulating layer 244, the spacer 246 and the undercut pattern 228a are removed by wet etching with an etchant such as HF. By removing the second insulating layer 244, an undercut region S2 is formed between the storage electrode 240b and the interlayer dielectric layer pattern 220a. The capacitor can be completed by sequentially forming a dielectric layer and a second conductive layer. The second conductive layer is used as the plate electrode and may comprise, for example, a doped polysilicon layer.

A feature of the second method described above is that the etching depth can be controlled using the etching stop layer pattern 224a. The etching stop layer pattern 224a operates as an etch stop when removing the insulating layer 244, the spacer 246 and the undercut pattern 228a, even though the etching rate of the interlayer dielectric layer pattern 220a may be identical to that of the second insulating layer 244 and/or the spacer 246. Furthermore, the cell capacitance can be increased since more surface area of the storage electrode 240b is exposed by removing the undercut pattern 228a.

Figure 17:
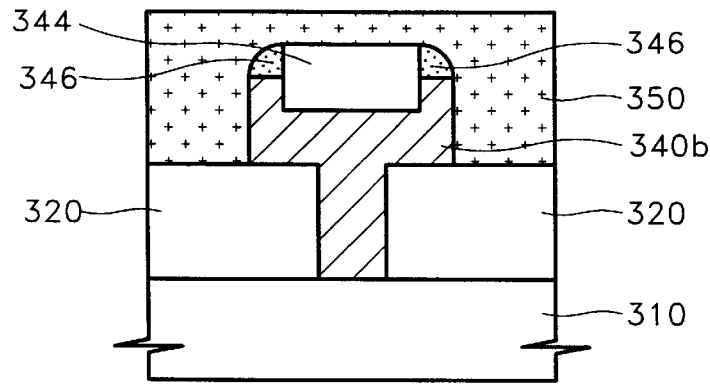
FIGS. 17 to 19 are cross-sectional views illustrating steps of a method for fabricating a capacitor according to a third aspect of the present invention.

A method for fabricating a capacitor according to a third aspect of the present invention is described below with reference to FIGS. 17 to 19. In FIG. 17, the steps of forming a cylindrical storage electrode 340b and photoresist layer 350 are illustrated. The cylindrical storage electrode 340b is formed by patterning the conductive layer using steps similar to those described above with reference to FIGS. 4 to 9. The insulating layer 344 and a spacer 346, however, can comprise the insulating material disclosed in the second method.

The photoresist layer 350 is then formed on the storage electrode, the spacer, the insulating layer, and the interlayer dielectric layer. This photoresist layer can be used to protect the interlayer dielectric layer when removing the insulating layer 344 and the spacer 346.

Figure 18:
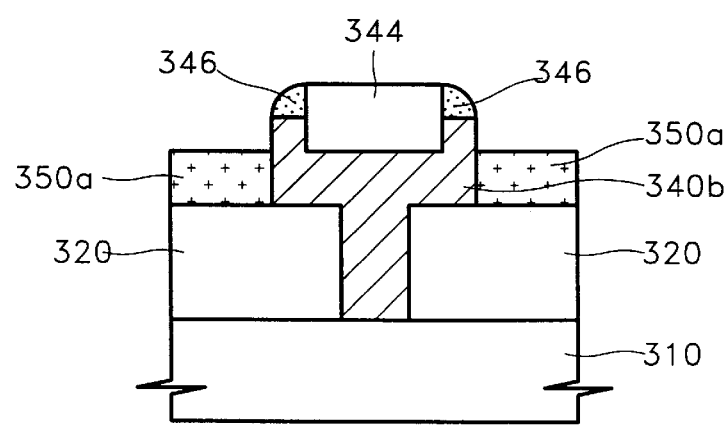

In FIG. 18, the step of forming a protective layer 350a is illustrated. In particular, the protective layer 350a is formed by etching back the photoresist layer 350 to expose the insulating layer 344 and the spacer 346. Thus, the residual photoresist layer 350 forms the protective layer 350a on the interlayer dielectric layer 320.

Figure 19:
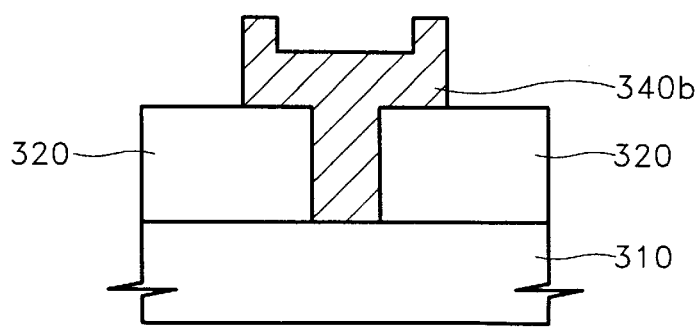

In FIG. 19, the step of removing the insulating layer 344 and the spacer 346 is illustrated. Specifically, the insulating layer 344 and the spacer 346 can be removed by wet etching in substantially the same manner as previously disclosed. Because the interlayer dielectric layer 320 is covered by the protective layer 350a, the interlayer dielectric layer 320 is not etched when removing the insulating layer 344 and the spacer 346. The protective layer 350a can then be removed to expose the interlayer dielectric layer 320. As described above with reference to FIG. 11, the capacitor can be completed by sequentially forming a dielectric layer and a second conductive layer. The second conductive layer is used as the plate electrode and may comprise, for example, a doped polysilicon layer.

In accordance with the teachings of the present invention, a capacitor can be fabricated that has improved capacitance and a reduced step difference between a memory cell array region and a peripheral circuit region. Accordingly, it is possible to improve the patterns and step coverage of the capacitor in subsequent fabrication processes, and in particular, metallization processes.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for fabricating an electrode structure, said method comprising the steps of:

forming an interlayer dielectric layer on a substrate;

forming a contact hole in said interlayer dielectric layer to expose a portion of said substrate;

forming a conductive layer on said interlayer dielectric layer and in said contact hole;

etching a first hole in said conductive layer, said first hole extending opposite said contact hole and having a depth less than a thickness of said conductive layer;

forming an insulating layer in said first hole, said insulating layer extending opposite said contact hole;

etching said conductive layer using said insulating layer as an etching mask so as to expose a sidewall of an upper portion of said insulating layer;

forming a spacer on said sidewall of said upper portion of said insulating layer; and etching said conductive layer using said insulating layer and said spacer as an etching mask.

2. A method according to claim 1, further comprising the steps of:

removing said insulating layer and said spacer;

forming a dielectric layer on said electrode structure; and forming a second conductive layer on said dielectric layer.

3. A method according to claim 2, further comprising the step of forming an undercut region between said electrode structure and said interlayer dielectric layer.

4. A method according to claim 3, wherein the step of forming an undercut region is performed substantially simultaneously with the step of removing said insulating layer and said spacer, and wherein said step of forming said undercut region includes the step of etching said interlayer dielectric layer to a depth less than a thickness of said interlayer dielectric layer.

5. A method according to claim 3, wherein a first etching rate of a first material comprising said interlayer dielectric layer is lower than a second etching rate of a second material comprising said insulating layer and a third etching rate of a third material comprising said spacer.

6. A method according to claim 3, wherein said interlayer dielectric layer comprises borophosphosilicate glass (BPSG).

7. A method according to claim 3, wherein said insulating layer comprises tetra-ethyl-orthosilicate (TEOS) based oxide.

8. A method according to claim 3, wherein said spacer comprises an oxide film formed using plasma enhanced chemical vapor deposition (PECVD) with a source gas comprising $SiH_4$.

9. A method according to claim 3, wherein the step of forming said conductive layer is preceded by the steps of:

forming an etching stop layer on said interlayer dielectric layer; and forming a second insulating layer on said etching stop layer.

10. A method according to claim 9, wherein said second insulating layer is removed during the step of removing said insulating layer and said spacer.

11. A method according to claim 9, wherein said etching stop layer is approximately 100 Å–200 Å thick.

12. A method according to claim 9, wherein said second insulating layer is 1000 Å–2000 Å thick.

13. A method according to claim 11, wherein said etching stop layer comprises a material chosen from a group consisting of SiN and SiON.

14. A method according to claim 3, wherein the step of removing said insulating layer and said spacer is preceded by the steps of:

forming a protective layer on said electrode structure and said interlayer dielectric layer; and etching back said protective layer to a thickness that exposes said insulating layer and said spacer.

15. A method according to claim 14, wherein the step of removing said insulating layer and said spacer is followed by the step of removing said protective layer so as to expose said interlayer dielectric layer.

16. A method according to claim 14, wherein said protective layer comprises a photoresist.

17. A method for fabricating a capacitor of an integrated circuit device, said method comprising the steps of:

forming an interlayer dielectric layer on a substrate; and forming a contact hole in said interlayer dielectric layer exposing a portion of said substrate;

forming a first conductive layer on said interlayer dielectric layer, wherein said first conductive layer is electrically connected to said substrate through said contact hole;

etching a hole in said first conductive layer above said contact hole, wherein said hole has a depth less than a thickness of said first conductive layer;

forming an insulating layer in said hole;

etching said conductive layer using said insulating layer as an etching mask to expose a sidewall of an upper portion of said insulating layer;

forming a spacer on said sidewall of said upper portion of said insulating layer;

etching said first conductive layer using said insulating layer and said spacer as etching masks to form an electrode structure;

removing said insulating layer and said spacer;

forming a dielectric layer on said electrode structure; and forming a second conductive layer on said dielectric layer.

18. A method according to claim 17, wherein said interlayer dielectric layer comprises borophosphosilicate glass (BPSG), said insulating layer comprises tetra-ethyl-orthosilicate (TEOS) based oxide, and said spacer comprises an oxide film formed using plasma enhanced chemical vapor deposition (PECVD) with a source gas comprising $SiH_4$.

19. A method according to claim 17, wherein the step of forming said conductive layer is preceded by the steps of forming an etching stop layer on said interlayer dielectric layer and forming a second insulating layer on said etching stop layer, and wherein said second insulating layer is removed during the step of removing said insulating layer and said spacer.

20. A method according to claim 19, wherein said etching stop layer comprises a material chosen from a group consisting of SiN and SiON.

21. A method according to claim 17, wherein the step of removing said insulating layer and said spacer is preceded by the steps of forming a protective layer on said electrode structure and said interlayer dielectric layer and etching back said protective layer to a thickness that exposes said insulating layer and said spacer, and wherein the step of removing said insulating layer and said spacer is followed by the step of removing said protective layer so as to expose said interlayer dielectric layer.

22. A method according to claim 21, wherein said protective layer comprises a photoresist.

* * * * *